(12) United States Patent
Matsuo et al.

(10) Patent No.: US 9,669,515 B2
(45) Date of Patent: Jun. 6, 2017

(54) POLISHING APPARATUS

(71) Applicants: EBARA CORPORATION, Tokyo (JP); Kyushu Institute of Technology, Fukuoka (JP)

(72) Inventors: Hisanori Matsuo, Tokyo (JP); Yoshihiro Mochizuki, Tokyo (JP); Keisuke Suzuki, Fukuoka (JP); Takahiro Tajiri, Fukuoka (JP); Souichirou Ichioka, Fukuoka (JP)

(73) Assignees: Ebara Corporation, Tokyo (JP); Kyushu Institute of Technology, Fukuoka (JP)

( * ) Notice: Subject to any disclaimer, the term of this patent is extended or adjusted under 35 U.S.C. 154(b) by 0 days.

(21) Appl. No.: 14/645,372

(22) Filed: Mar. 11, 2015

(65) Prior Publication Data

US 2015/0283669 A1    Oct. 8, 2015

(30) Foreign Application Priority Data

Mar. 13, 2014 (JP) ................................ 2014-050546

(51) Int. Cl.
    *H01L 21/00* (2006.01)
    *B24B 49/12* (2006.01)
    (Continued)

(52) U.S. Cl.
    CPC ............ *B24B 49/12* (2013.01); *B24B 53/017* (2013.01); *H01L 21/3212* (2013.01)

(58) Field of Classification Search
    CPC .... B24B 49/12; B24B 53/017; H01L 21/3212
    See application file for complete search history.

(56) References Cited

U.S. PATENT DOCUMENTS 6,264,532 B1 * 7/2001 Meloni ............... B24B 37/0053
                                                    451/21
2004/0214508 A1 * 10/2004 Gotkis .................... B24B 1/005
                                                    451/5
(Continued)

FOREIGN PATENT DOCUMENTS

| JP | H09-119822 | 5/1997 |
| JP | 2003-151934 | 5/2003 |
| JP | 2012-137484 | 7/2012 |

OTHER PUBLICATIONS

Takashi et al. ("Study on evaluation method for surface topography of CMP polishing pad based on optical Fourier transform (2nd report)—Development of 6 scattering light measuring system—", The Japan Society for Precision Engineering T Spring Meeting Academic Conference Lecture Paper; 2012; distributed Mar. 14, 2012; p. 823-824).*

(Continued)

*Primary Examiner* — Phat X Cao
*Assistant Examiner* — Mohammad M Hoque
(74) *Attorney, Agent, or Firm* — Baker & Hostetler LLP

(57) ABSTRACT

A polishing apparatus having a polishing pad surface property measuring device that is capable of measuring surface properties of a polishing pad in a state where a liquid film exists on the polishing pad is disclosed. The polishing apparatus includes a dam configured to dam a liquid on the polishing pad to form a liquid film having a thickness equal to or greater than a prescribed value in at least part of an area on the polishing pad, a light emitter having a light emission end disposed in the liquid film formed by the dam and configured to emit a laser beam onto the polishing pad, a light receiver disposed in the liquid film formed by the dam and configured to receive light scattered by and bounced off the polishing pad at a plurality of angles due to surface properties of the polishing pad after the laser beam is emitted (Continued)

from the light emitter, and a processor configured to perform Fourier transform on the light received by the light receiver into a predetermined wavelength corresponding to a reflection intensity distribution and to determine a feature quantity of the surface properties of the pad.

11 Claims, 8 Drawing Sheets

(51) Int. Cl.
  *B24B 53/017* (2012.01)
  *H01L 21/321* (2006.01)

(56) References Cited

U.S. PATENT DOCUMENTS

| | | | | |
|---|---|---|---|---|
| 2007/0020918 | A1* | 1/2007 | Hirokawa | B23H 5/08 438/626 |
| 2012/0244649 | A1* | 9/2012 | Sano | B24B 37/0053 438/17 |
| 2013/0052916 | A1* | 2/2013 | David | B24B 37/013 451/5 |
| 2014/0262027 | A1 | 9/2014 | Matsuo et al. | |
| 2014/0273308 | A1 | 9/2014 | Matsuo et al. | |

OTHER PUBLICATIONS

Takashi Kushida et al.; "Study on evaluation method for surface topography of CMP polishing pad based on optical Fourier transform (2nd report)—Development of scattering light measuring system—", The Japan Society for Precision Engineering Spring Meeting Academic Conference Lecture Paper; 2012; distributed Mar. 14, 2012; p. 823-824.

Takashi Kushida et al., "Study on evaluation method for surface topography of CMP polishing pad based on optical Fourier transform", The Japan Society for Precision Engineering Autumn Meeting Academic Conference Lecture Paper; 2011; distributed Sep. 20, 2011; p. 159-160.

* cited by examiner

POLISHING APPARATUS

CROSS REFERENCE TO RELATED APPLICATION

This document claims priority to Japanese Patent Application Number 2014-050546 filed Mar. 13, 2014, the entire contents of which are hereby incorporated by reference.

BACKGROUND

In recent years, high integration and high density in semiconductor device demands smaller and smaller wiring patterns or interconnections and also more and more interconnection layers. Multilayer interconnections in smaller circuits result in greater steps which reflect surface irregularities on lower interconnection layers. An increase in the number of interconnection layers makes film coating performance (step coverage) poor over stepped configurations of thin films. Therefore, better multilayer interconnections need to have the improved step coverage and proper surface planarization. Further, since the depth of focus of a photolithographic optical system is smaller with miniaturization of a photolithographic process, a surface of the semiconductor device needs to be planarized such that irregular steps on the surface of the semiconductor device will fall within the depth of focus.

Thus, in a manufacturing process of a semiconductor device, it increasingly becomes important to planarize a surface of the semiconductor device. One of the most important planarizing technologies is chemical mechanical polishing (CMP). In the chemical mechanical polishing, using a polishing apparatus, while a polishing liquid containing abrasive particles such as silica ($SiO_2$) or ceria ($CeO_2$) therein is supplied onto a polishing pad, a substrate such as a semiconductor wafer is brought into sliding contact with the polishing pad, so that the substrate is polished.

The polishing apparatus for performing the above CMP process includes a polishing table having a polishing pad, and a substrate holding device, which is referred to as a carrier or a top ring, for holding a substrate such as a semiconductor wafer. By using such a polishing apparatus, the substrate is held and pressed against the polishing pad under a predetermined pressure by the substrate holding device, thereby polishing an insulating film or a metal film on the substrate.

After one or more substrates have been polished, abrasive particles or ground-off particles of the substrate are attached to the surface of the polishing pad, and surface configuration or surface condition of the polishing pad is changed, resulting in deterioration in polishing performance. Therefore, as the substrates are repeatedly polished by the same polishing pad, a polishing rate is lowered and nonuniform polishing action is caused. Thus, dressing (conditioning) of the polishing pad is performed to regenerate the surface configuration or surface condition of the polishing pad which has deteriorated.

According to CMP, generally, a combination of consumable members (a pad and a dresser) and pad dressing conditions for achieving a desired CMP performance are applied. However, the consumable members are subject to individual differences and aging variation, and it is necessary to apply optimum dressing conditions in each dressing in order to achieve a stable desired CMP performance. Further, the CMP apparatus is not equipped with a device for measuring pad surface properties such as surface roughness.

As a method of measuring surface properties of the polishing pad of CMP, there has been proposed a technology disclosed in Japanese Laid-open patent publication No. 9-119822. According to the proposed method, a liquid that exists at all times on the surface of the pad is removed by gas jet in order to measure the surface properties of the pad.

According to conventional methods, dressing conditions for achieving a stable CMP performance are applied on experiential grounds because information about surface properties of pads has not been obtained. Variations due to individual differences and aging variation of consumable members are tolerated at present.

Further, according to the method disclosed in Japanese Laid-open patent publication No. 9-119822, although it is considered that surface properties of the pad can be obtained, surface properties of the pad cannot be obtained in a wet state of the pad which is prevalent in actual polishing because a liquid film that exists at all times on the pad is removed by gas jet.

On the other hand, if an attempt is made to measure surface properties of the pad by using light in a state where a liquid film exists on the pad surface, then it is problematic that correct information about the pad surface cannot be obtained because the light is reflected and scattered by the interface of the liquid film. Specifically, light emitted from a light emitter travels through the atmosphere, and is then reflected and scattered into the atmosphere by the interface between the air and the liquid film. Only the light that has entered the liquid film from the interface is applied to the surface of the polishing pad. Scattered light that is reflected and scattered by the surface of the polishing pad travels through the liquid film, and is then reflected and scattered into the liquid film by the interface between the liquid film and the air. Only the scattered light that has entered the atmosphere from the interface reaches a light receiver. Consequently, it is problematic that correct information about the pad surface cannot be obtained from the light that has reached the light receiver.

SUMMARY OF THE INVENTION

According to an embodiment, there is provided a polishing apparatus having a polishing pad surface property measuring device that is capable of measuring surface properties of a polishing pad in a state where a liquid film exists on the polishing pad.

Further, according to an embodiment, there is provided a polishing method for setting operating conditions based on measurement result of surface properties of a polishing pad, and polishing a substrate or dressing the polishing pad under the set operating conditions.

Embodiments, which will be described below, relate to a polishing apparatus having a polishing pad surface property measuring device for measuring surface properties such as surface topography or surface condition of a polishing pad used for polishing a substrate such as a semiconductor wafer.

According to a first embodiment, there is provided a polishing apparatus for polishing a substrate by pressing the substrate against a polishing pad on a polishing table, comprising: a dam configured to dam a liquid on the polishing pad to form a liquid film having a thickness equal to or greater than a prescribed value, in at least part of an area on the polishing pad; a light emitter configured to emit a laser beam onto the polishing pad, the light emitter having a light emission end disposed in the liquid film formed by the dam; a light receiver configured to receive light scattered by and bounced off the polishing pad at a plurality of angles due to surface properties of the polishing pad, after the laser beam is emitted from the light emitter, the light receiver being disposed in the liquid film formed by the dam; and a processor configured to perform Fourier transform on the light received by the light receiver into a predetermined wavelength corresponding to a reflection intensity distribution and to determine a feature quantity of the surface properties of the pad.

According to a second embodiment, there is provided a polishing apparatus for polishing a substrate by pressing the substrate against a polishing pad on a polishing table, comprising: a dam configured to dam a liquid on the polishing pad to form a liquid film having a thickness equal to or greater than a prescribed value, in at least part of an area on the polishing pad; a light emitter configured to emit a laser beam onto the polishing pad, the light emitter having a light emission end disposed in the liquid film formed by the dam; a light receiver configured to receive light, the light receiver being disposed outside of the liquid film; an optical-path forming member configured to form an optical path for allowing the light receiver to receive light scattered by and bounced off the polishing pad at a plurality of angles due to surface properties of the polishing pad, after the laser beam is emitted from the light emitter, the optical-path forming member being disposed so as to straddle the liquid film formed by the dam and the atmosphere above the light film; and a processor configured to perform Fourier transform on the light received by the light receiver into a predetermined wavelength corresponding to a reflection intensity distribution and to determine a feature quantity of the surface properties of the pad.

According to a third embodiment, there is provided a polishing apparatus for polishing a substrate by pressing the substrate against a polishing pad on a polishing table, comprising: a dam configured to dam a liquid on the polishing pad to form a liquid film having a thickness equal to or greater than a prescribed value, in at least part of an area on the polishing pad; a light emitter configured to emit a laser beam, the light emitter being disposed in the atmosphere; a light receiver configured to receive light, the light receiver being disposed in the atmosphere; an optical-path forming member configured to form an optical path for allowing the laser beam emitted from the light emitter to reach the polishing pad under the liquid film and allowing the light receiver to receive light scattered by and bounced off the polishing pad at a plurality of angles due to surface properties of the polishing pad, the optical-path forming member being disposed so as to straddle the liquid film formed by the dam and the atmosphere above the light film and being spaced from the polishing pad; and a processor configured to perform Fourier transform on the light received by the light receiver into a predetermined wavelength corresponding to a reflection intensity distribution and to determine a feature quantity of the surface properties of the pad.

(1) According to the above embodiments, the surface properties of the pad is measured by the laser beam. A dam for damming a liquid on the polishing pad is provided to form a liquid film having a thickness equal to or greater than a prescribed value, in at least part of an area on the polishing pad. The laser beam travels through the liquid film and is applied to the surface of the polishing pad. According to the first embodiment described above, the light emitter and the light receiver are both disposed in the liquid film on the polishing pad.

(2) According to the second and third embodiments described above, because an optical-path forming member is provided so as to straddle the liquid film and an air layer above the liquid film, at least one of the light emitter and the light receiver is disposed in the air layer outside of the liquid film. With this arrangement, the polishing apparatus can employ a light emitter and a light receiver which may not be suitable for use in a liquid environment. Further, the refractive index of the material of the optical-path forming member and the shape of the optical-path forming member may be optimized to form a desired optical path and to apply the laser beam at a desired angle of incidence to the surface of the pad.

(3) According to the above embodiments, the polishing apparatus has a processor for performing Fourier transform on the light received by the light receiver into a predetermined wavelength corresponding to a reflection intensity distribution, and determining a feature quantity of the surface properties of the pad. Therefore, the processor quantitatively acquires the surface properties of the pad that is correlated to the CMP performance, and adjusts dressing parameters including a dressing load, a dresser rotational speed, a table rotational speed, a dresser swinging speed, and a dressing time on the basis of the acquired surface properties.

According to one of the embodiments, the optical-path forming member comprises a prism having a triangular cross-sectional shape or a quadrangular cross-sectional shape.

According to the above embodiment, the optical-path forming member having a triangular cross-sectional shape or a quadrangular cross-sectional shape provides at least two refractive surfaces.

According to one of the embodiments, the light emitter is connected to a light source by an optical fiber.

According to one of the embodiments, the light emitter and/or the optical-path forming member is disposed such that the laser beam is applied from the light emitter to a surface of the polishing pad at an angle of 80 degrees±10 degrees with respect to a line perpendicular to the polishing pad.

According to the above embodiment, since the angle of incidence of the laser beam to the polishing pad is set to about 80 degrees, i.e., 80 degrees±10 degrees, surface properties of the pad that are well correlated to the CMP performance can be measured.

According to one of the embodiments, the light receiver comprises a plurality of optical fibers.

According to the above embodiment, since the light receiver comprises a plurality of optical fibers comprising a fiber array, a fiber matrix, or the like, the light having a plurality of scattering angles can be received.

According to one of the embodiments, the light receiver comprises a CCD sensor or a CMOS sensor.

According to the above embodiment, the light receiver comprising a CCD sensor or a CMOS sensor may be disposed in the atmosphere or the liquid film. If the light receiver is disposed in the liquid film, waterproof treatment is applied to the light receiver.

According to one of the embodiments, the polishing apparatus further comprises a sensor configured to detect a position on the surface of the polishing pad and a moving mechanism configured to move at least two of the light emitter, the light receiver, and the optical-path forming member integrally, so that the laser beam is applied to a constant position on the surface of the polishing pad or the light is received from the surface of the polishing pad at a prescribed scattering angle.

According to a fourth embodiment, there is provided a polishing method comprising: using a polishing apparatus according to claim 1; and adjusting at least one of dressing parameters including a dressing load, a dresser rotational speed, a polishing table rotational speed, a dresser swinging speed, and a dresser swinging distance, on the basis of the feature quantity of the surface properties of the pad determined by the processor.

According to a fifth embodiment, there is provided a polishing method comprising: using a polishing apparatus according to claim 1; and estimating a service life of at least one of a dresser and the polishing pad on the basis of the feature quantity of the surface properties of the pad determined by the processor, and issuing an alarm if the estimated service life exceeds a predetermined value.

According to the above embodiments, since the surface properties of the polishing pad can be grasped in a state where the liquid film exists, the following stable operation of CMP can be performed:

(1) The cost of consumable members can be reduced because the polishing pad and the dresser can be used up without waste until the end of their service lives.

(2) Since an unsteady state of the surface properties of the pad due to some dressing abnormality can immediately be detected, any fabrication failures of semiconductor devices on account of CMP performance failures can be minimized.

(3) The surface properties of the pad can be kept at all times in a state required to ensure CMP performance by changing dressing conditions depending on a change in the surface properties of the pad.

DESCRIPTION OF EMBODIMENTS

Figure 1:
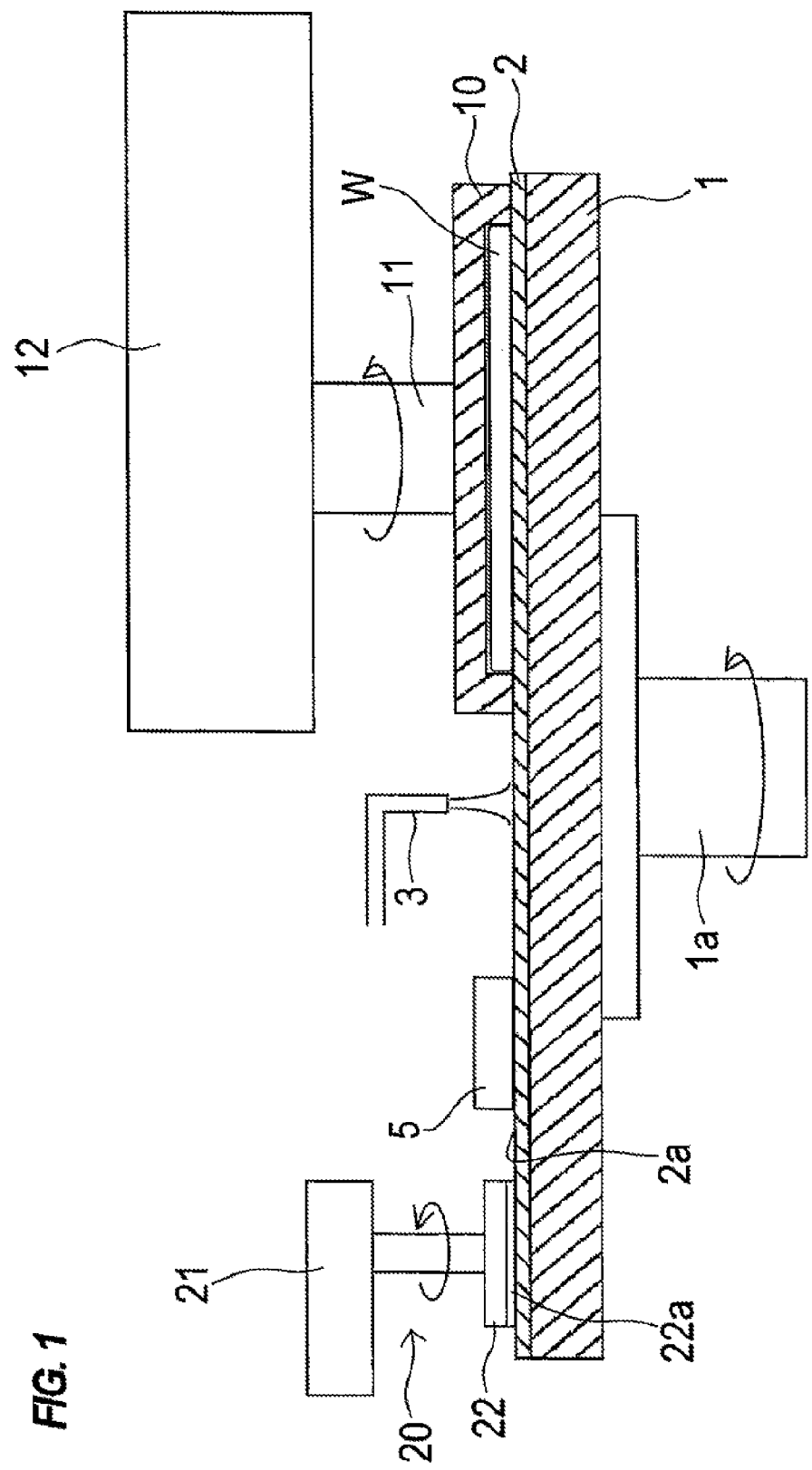
FIG. 1 is a schematic view showing an entire structure of a polishing apparatus having a surface property measuring device of a polishing pad according to an embodiment.

Embodiments of a polishing apparatus having an apparatus for measuring surface properties of a polishing pad will be described below with reference to FIGS. 1 through 8B.

Like or corresponding parts are denoted by corresponding reference numerals in FIGS. 1 through 8B and will not be described below repetitively.

FIG. 1 is a schematic view showing an entire structure of a polishing apparatus having a surface property measuring device of a polishing pad according to an embodiment. As shown in FIG. 1, the polishing apparatus comprises a polishing table 1, and a carrier 10 for holding a substrate W such as a semiconductor wafer as an object to be polished and pressing the substrate against a polishing pad on the polishing table. The polishing table 1 is coupled via a table shaft 1a to a polishing table rotating motor (not shown) disposed below the polishing table 1. Thus, the polishing table 1 is rotatable about the table shaft 1a. A polishing pad 2 is attached to an upper surface of the polishing table 1. An upper surface of the polishing pad 2 constitutes a polishing surface 2a for polishing the substrate W. The polishing pad 2 comprising SUBA 800, IC-1000, IC-1000/SUBA400 (two-layer cloth) or the like manufactured by the Dow Chemical Company is used. The SUBA 800 is non-woven fabrics bonded by urethane resin. The IC-1000 comprises a pad composed of hard polyurethane foam and having a large number of fine holes (pores) formed in its surface, and is also called a perforated pad. A polishing liquid supply nozzle 3 is provided above the polishing table 1 to supply a polishing liquid (slurry) onto the polishing pad 2 on the polishing table 1.

The carrier 10 is connected to a shaft 11, and the shaft 11 is vertically movable with respect to a carrier arm 12. When the shaft 11 moves vertically, the carrier 10 is lifted and lowered as a whole for positioning with respect to the carrier arm 12. The shaft 11 is configured to be rotated by driving a motor (not shown). The carrier 10 is rotated about an axis of the shaft 11.

As shown in FIG. 1, the polishing apparatus has a dam 5 disposed on the polishing pad 2 for storing a liquid on the polishing pad 2 by damming the liquid. The dam 5 comprises a plate which is formed into an arcuately curved shape. The dam 5 is configured to store the liquid on the polishing pad 2 by keeping the lower surface of the dam 5 in contact with the polishing pad 2 and damming the liquid with an inner circumferential surface of the dam 5.

As shown in FIG. 1, the carrier 10 is configured to hold the substrate W such as a semiconductor wafer on its lower surface. The carrier arm 12 is configured to be pivotable, and thus the carrier 10, which holds the substrate W on its lower surface, is movable from a position at which the carrier 10 receives the substrate to a position above the polishing table 1 by pivotable movement of the carrier arm 12. Then, the carrier 10 holds the substrate W on its lower surface and presses the substrate W against the surface (polishing surface) of the polishing pad 2. At this time, while the polishing table 1 and the carrier 10 are respectively rotated, a polishing liquid (slurry) is supplied onto the polishing pad 2 from the polishing liquid supply nozzle 3 provided above the polishing table 1. The polishing liquid containing silica ($SiO_2$) or ceria ($CeO_2$) as abrasive particles is used. In this manner, while the polishing liquid is supplied onto the polishing pad 2, the substrate W is pressed against the polishing pad 2 and is moved relative to the polishing pad 2 to polish an insulating film, a metal film or the like on the substrate. Examples of the insulating film include $SiO_2$, and examples of the metal film include a Cu film, a W film, a Ta film and a Ti film.

As shown in FIG. 1, the polishing apparatus has a dressing apparatus 20 for dressing the polishing pad 2. The dressing apparatus 20 comprises a dresser arm 21, and a dresser 22 which is rotatably attached to a forward end of the dresser arm 21. The lower part of the dresser 22 comprises a dressing member 22a, and the dressing member 22a has a circular dressing surface. Hard particles are fixed to the dressing surface by electrodeposition or the like. Examples of the hard particles include diamond particles, ceramic particles and the like. A motor (not shown) is provided in the dresser arm 21, and the dresser 22 is rotated by the motor. The dresser arm 21 is coupled to a lifting and lowering mechanism (not shown), and the dresser arm 21 is lowered by the lifting and lowering mechanism to allow the dressing member 22a to be pressed against the polishing surface 2a of the polishing pad 2. Equipments including the polishing table 1, the carrier 10, the dressing apparatus 20 and the like are connected to a controller (not shown), and the rotational speed of the polishing table 1, the rotational speed and the polishing pressure of the carrier 10, the load, the rotational speed, the oscillating speed of the dresser 22, and the like are controlled by the controller.

Figure 2:
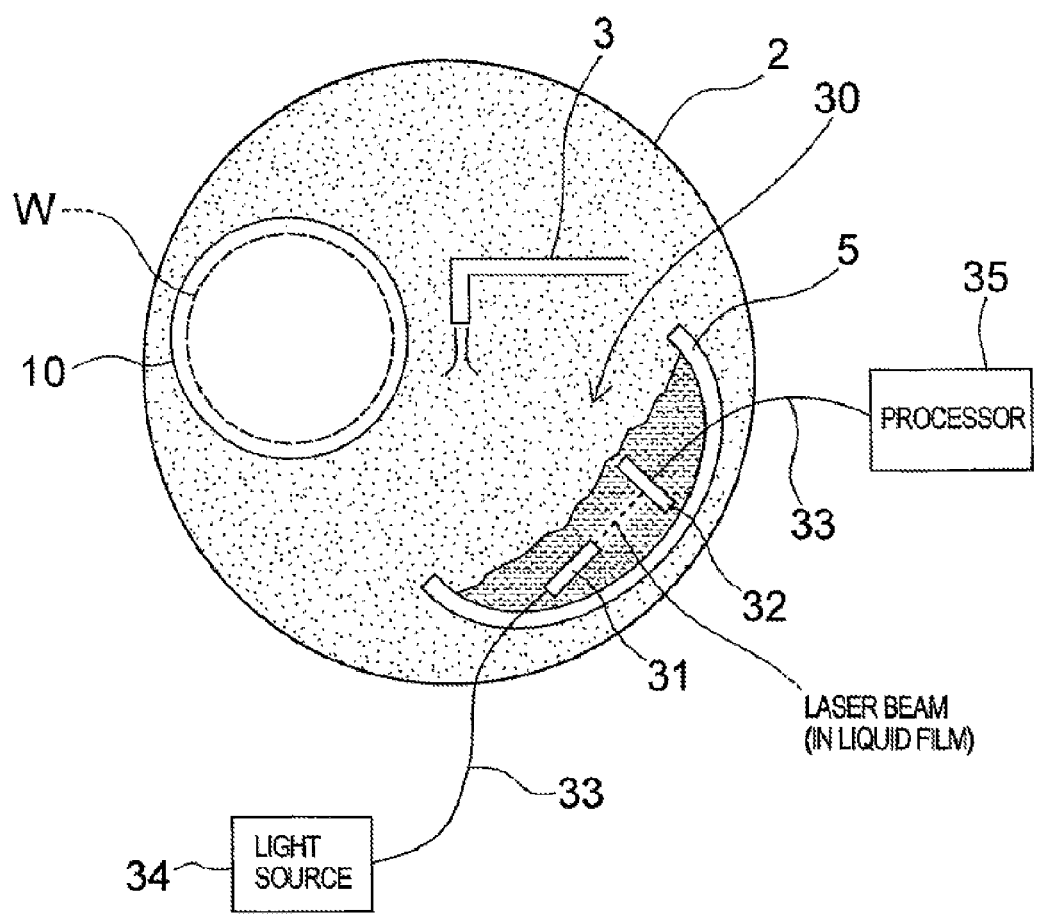
FIG. 2 is a plan view of the polishing apparatus shown in FIG. 1.
Figure 3:
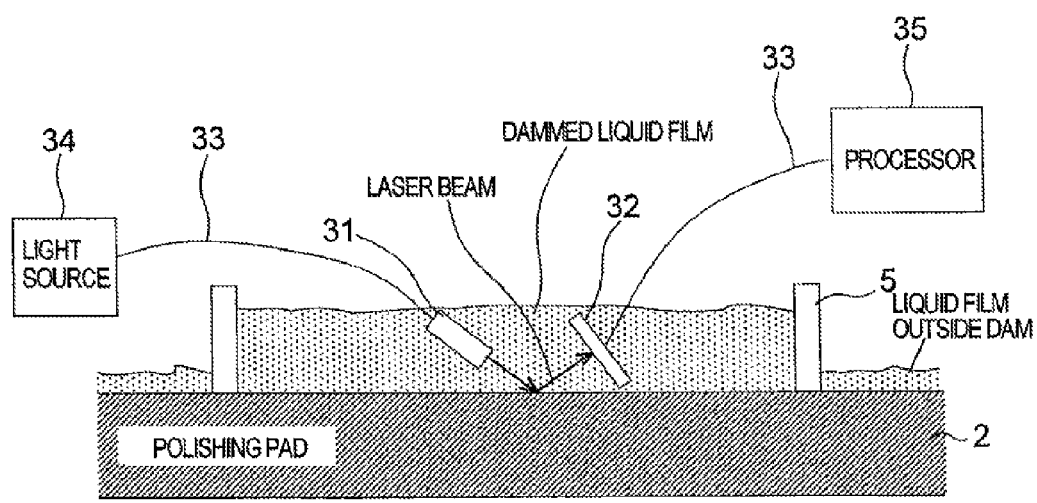
FIG. 3 is a vertical cross-sectional view of main part of FIG. 2.

FIG. 2 is a plan view of the polishing apparatus shown in FIG. 1. In FIG. 2, the dressing device 20 is omitted from illustration. FIG. 3 is a vertical cross-sectional view of main part of FIG. 2.

As shown in FIG. 2, the polishing apparatus includes a polishing pad surface property measuring device 30 for measuring surface properties, such as surface topography or surface condition, of the polishing pad 2. The polishing pad surface property measuring device 30 has a light emitter 31 for applying a laser beam to the polishing pad 2, and a light receiver 32 for receiving light scattered by and bounced off the polishing pad 2 at a plurality of angles due to the surface properties of the polishing pad 2. The dam 5 comprising a plate which is formed into an arcuately curved shape is disposed on the polishing pad 2.

As shown in FIG. 3, because the dam 5 comprising the arcuately curved plate has a lower surface which is brought in contact with the polishing pad 2, the inner circumferential surface of the dam 5 dams and stores a liquid (for example, water). The light emitter 30 and the light receiver 32, which constitute the polishing pad surface property measuring device 30, are disposed in the liquid dammed by the dam 5. The dam 5 is set to an appropriate size so that the dam 5 forms a liquid film having an appropriate thickness and allows the liquid to circulate appropriately in the dam 5. Specifically, the liquid flows into the dam 5, and the liquid which has flowed into the dam 5 replaces the liquid flowing out of the dam 5, so that the liquid flows at all times.

As shown in FIGS. 2 and 3, the light emitter 31 is connected to a light source 34 through an optical fiber 33. The light source 34 emits a laser beam having a predetermined wavelength toward the light emitter 31, and the light emitter 31 applies the laser beam emitted from the light source 34 to the surface of the polishing pad 2. The light receiver 32, which comprises a CCD sensor, receives the light scattered by and bounced off the polishing pad 2 at a plurality of angles due to the surface properties of the polishing pad 2. The light receiver 32 may comprise a CMOS sensor, a photodiode array, or a photomultiplier array. The light receiver 32 is connected to a processor 35 through an optical fiber 33. The processor 35 calculates a feature quantity of pad surface properties that is correlated to the CMP performance from the information of the light received by the light receiver 32. Specifically, the processor 35 performs Fourier transform on the light received by the light receiver 32 into a predetermined wavelength corresponding to a reflection intensity distribution, and calculates a feature quantity of surface properties of the pad. More specifically, the processor 35 determines a feature quantity of the pad according to the following method: The locations of pixels for detecting light in the CCD sensor are regarded as detecting positions, a distribution of detected intensities of light obtained by the respective pixels is regarded as an intensity distribution of light, and a function representing the relationship between the detecting positions and the intensity distribution of light is determined. The detecting positions are determined depending on the angles of scattered light corresponding to wavelengths which characterize surface irregularities of the surface properties of the pad. Therefore, information of the surface properties of the pad is obtained by measuring the detecting positions. A fast Fourier transform processing (FFT processing) is performed on the function representing the relationship between the detecting positions and the intensity distribution of light, thereby converting the function into a relationship between the wavelengths characterizing the surface properties of the pad and the signal intensities at the respective wavelengths, so that a feature quantity of the pad surface is calculated. A signal from the processor 35 is inputted into a controller of the CMP apparatus. The processor 35 may be incorporated in the controller of the CMP apparatus.

Figure 4:
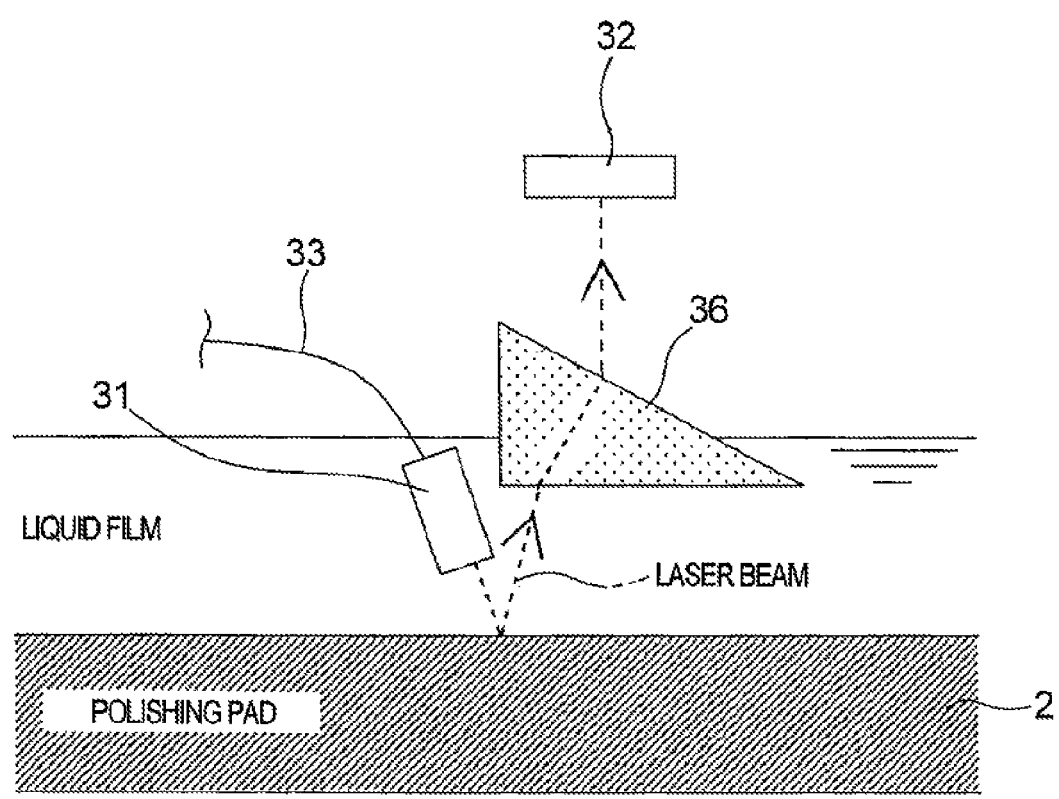
FIG. 4 is a schematic elevational view showing a polishing pad surface property measuring device according to another embodiment.

FIG. 4 is a schematic elevational view showing a polishing pad surface property measuring device 30 according to another embodiment. In the polishing pad surface property measuring device 30 according to the embodiment shown in FIG. 4, only a light emitter 31 is disposed in the dammed liquid, and a light receiver 32 is disposed in the air outside of the liquid film. The polishing pad surface property measuring device 30 has an optical-path forming member 36 provided so as to straddle the liquid film and the air layer above the liquid film. The optical-path forming member 36 comprises a prism having a triangular cross-sectional shape, for example. Since the optical-path forming member 36 is thus provided, the optical path is free of an unstable gas-liquid interface. The refractive index, shape, and installation position of the optical-path forming member 36 may be optimized to freely select the installation position of the light receiver 32 and an irradiation angle of light applied to the surface of the pad. At this time, the optical mediums through which the laser beam travels include air, water (the liquid film may be mixed with some slurry), and the optical-path forming member 36. The optical-path forming member 36 is made of glass, for example. In this case, the refractive indexes of the respective mediums are approximately air; 1.00, water; 1.33, and glass; 1.46, respectively, and thus the light travels generally as shown in FIG. 4. Specifically, a laser beam that is emitted from the light emitter 31 travels through the liquid, and is then applied to the polishing pad 2. Then, the light that is scattered by and bounded off the polishing pad 2 at a plurality of angles depending on the surface properties of the polishing pad 2 travels through the liquid and is refracted by two refractive surfaces of the optical-path forming member 36, and is then received by the light receiver 32. By changing the material and shape of the optical-path forming member 36, the optical path can freely be changed, thus giving the degree of freedom for the installation positions where the light emitter 31 and the light receiver 32 are installed.

Figure 5:
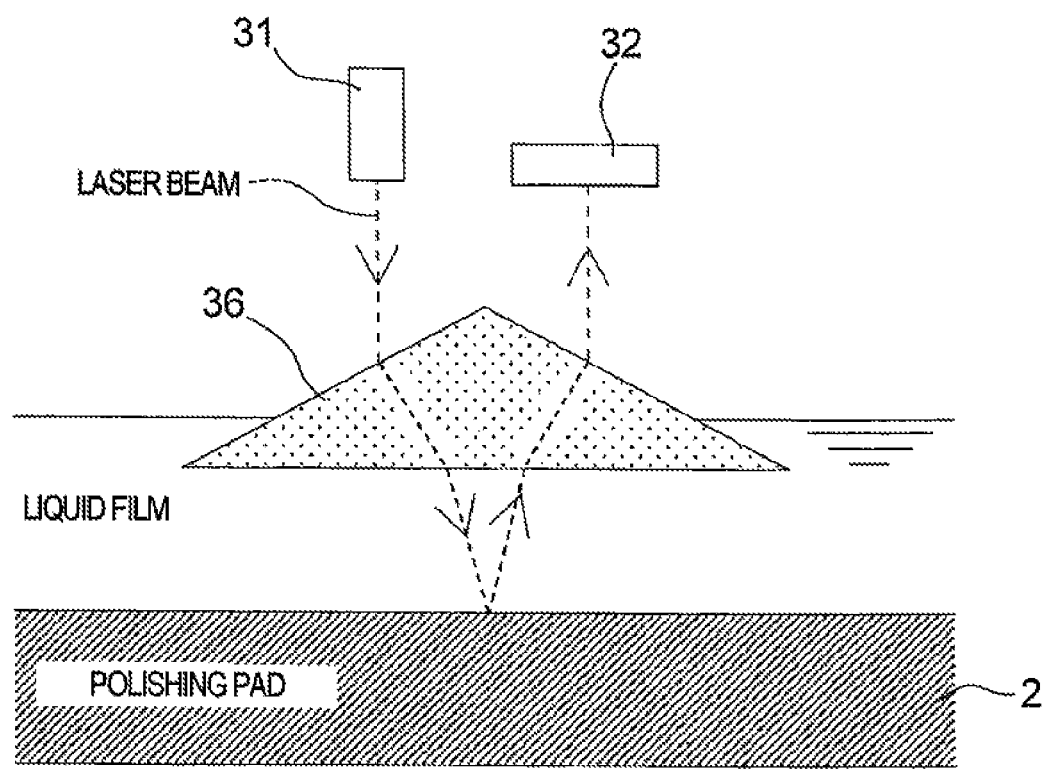
FIG. 5 is a schematic elevational view showing a polishing pad surface property measuring device according to still another embodiment.

FIG. 5 is a schematic elevational view showing a polishing pad surface property measuring device 30 according to still another embodiment. In polishing pad surface property measuring device 30 according to the embodiment shown in FIG. 5, a light emitter 31 and a light receiver 32 are both disposed in the air outside of the liquid film. Also in the embodiment shown in FIG. 5, an optical-path forming member 36 is provided so as to straddle the liquid film and the air layer above the liquid film. The laser beam emitted from the light emitter 31 travels through the air and is refracted by two refractive surfaces of the optical-path forming member 36, and then travels through the liquid and is applied to the polishing pad 2. The light that is scattered by and bounced off the polishing pad 2 at a plurality of angles due to the surface properties of the polishing pad 2 travels through the liquid, and is applied to the optical-path forming member 36. Then, the light is refracted by two refractive surfaces of the optical-path forming member 36, and then travels through the air and is received by the light receiver 32. In this case also, because the optical path is free of an unstable gas-liquid interface, the surface properties of the polishing pad 2 can stably be measured.

Generally, inasmuch as a liquid film that exists on a polishing pad is less than 1 mm thick, the optical path as shown in FIG. 5 cannot stably be obtained unless a liquid film having a thickness equal to or greater than a prescribed value is formed by the dam 5. Therefore, even in the case where both the light emitter 31 and the light receiver 32 are disposed in the air and no space is required to place them in the liquid, it is necessary for the dam 5 to form a liquid film having a thickness equal to or greater than a prescribed value. Because the optical path includes two medium interfaces, i.e., a medium interface between the air and the optical-path forming member and a medium interface between the optical-path forming member and the liquid, the optical-path forming member 36 needs to have at least two refractive surfaces. In order to meet such a need, the simplest shape of the optical-path forming member 36 may be a triangular cross-sectional shape as shown in FIG. 5. However, the function of the present invention can be fulfilled by polygonal cross-sectional shapes including a quadrangular cross-sectional shape. The polishing pad 2 has its thickness changed as it is worn by the dressing process. In order to obtain accurate surface properties of the pad, the light emitter 31, the light receiver 32, the optical-path forming member 36 (if installed), and the pad surface are required to be kept in a constant positional relationship. Therefore, the polishing pad surface property measuring device 30 has a mechanism for measuring the height (thickness) of the polishing pad and moving the optical system (the light emitter, the light receiver, and the optical path) depending on a change in the height of the pad. Specifically, the height of the polishing pad is measured by a sensor, and the light emitter 31, the light receiver 32, and the optical-path forming member 36 are moved integrally on the basis of the measurement result until the light emitter 31, the light receiver 32, and the optical-path forming member 36 are brought into desired positions. Thus, the light receiver 32 is capable of receiving the light from the surface of the polishing pad at prescribed scattering angles.

According to the above embodiments, the dressing conditions and polishing conditions are optimized and the service lives of consumable members including the polishing pad 2 and the dresser 22 are detected on the basis of the surface properties of the polishing pad 2 determined by the processor 35. When the service life of a consumable member is detected, an alarm is issued. The dressing conditions include a dressing load, a dresser rotational speed, a polishing table rotational speed, a dresser swinging speed, and a dressing time. At least one parameter of these dressing conditions is optimized on the basis of the surface properties of the pad. For example, a surface roughness is determined as the surface properties of the pad, and the relationship between surface roughnesses of the pad and polishing rates is determined in advance, and an association between surface roughnesses of the pad and dressing conditions is determined in advance. If a measured surface roughness falls outside of a range for obtaining a desired polishing rate, then the predetermined association between surface roughnesses of the pad and dressing conditions is referred to, and the dressing condition is adjusted to achieve a surface roughness for obtaining the desired polishing rate.

Figure 6:
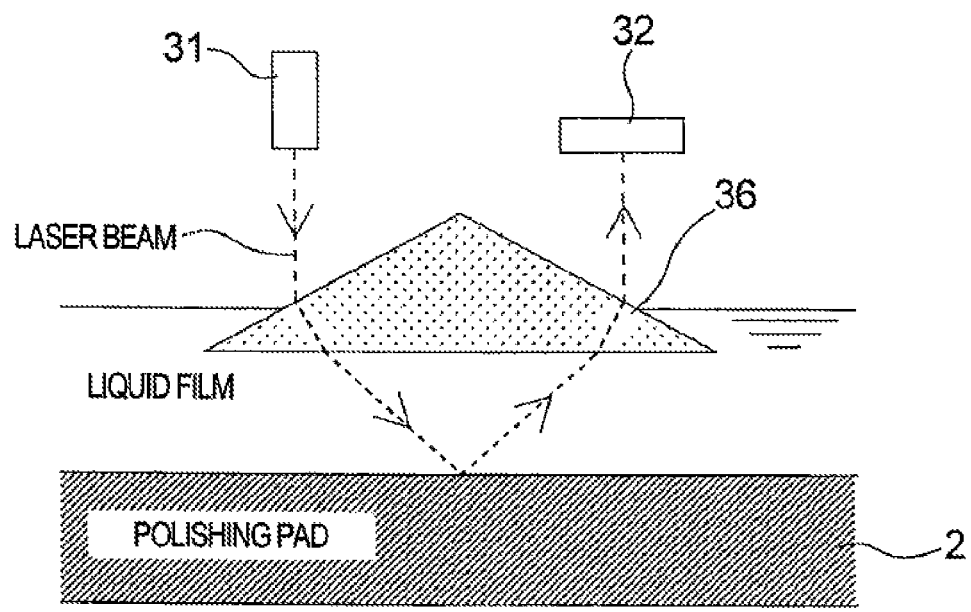
FIG. 6 is a schematic elevational view showing an example in which a refractive index of an optical-path forming member is changed to change an angle of incidence with respect to the polishing pad.

FIG. 6 is a schematic elevational view showing an example, which is identical in configuration to the embodiment shown in FIG. 5, in which the refractive index of the optical-path forming member 36 is changed to change the angle of incidence with respect to the polishing pad. According to the embodiment shown in FIG. 6, the refractive index of the optical-path forming member 36 differs from the refractive index of the optical-path forming member 36 shown in FIG. 5 to obtain a desired angle of incidence of the laser beam applied to the polishing pad 2.

For example, the angle of incidence with respect to the polishing pad is set to about 80 degrees, so that surface properties of the pad that are well correlated to the CMP performance can be measured. In this case, if the optical-path forming member 36 is made of glass, the refractive indexes of air, glass and water (liquid film) as the mediums for the laser beam are 1.0003 (air), 1.555 (glass), and 1.333 (water), respectively, and the irradiation angle with respect to the pad can be $\beta=80$ degrees by setting the angle of incidence of the laser beam with respect to the optical-path forming member 36 to $\alpha=56.4$ degrees, as shown in FIG. 7.

Figure 7:
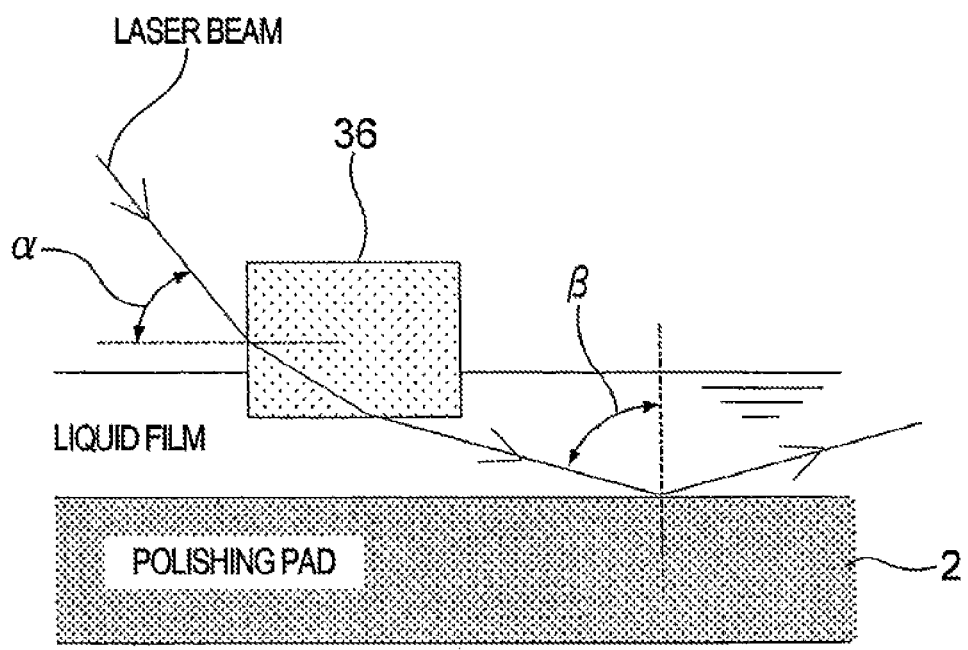
FIG. 7 is a schematic elevational view showing an embodiment in which an optical path is adjusted by the optical-path forming member to adjust the angle of incidence of the laser beam with respect to the polishing pad.
Figure 8A:
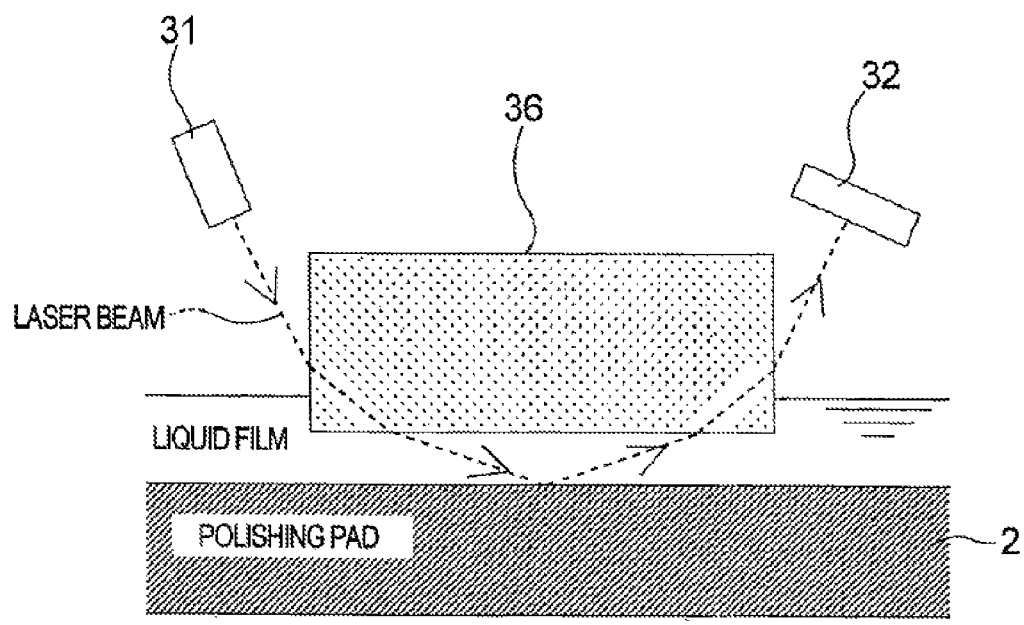
FIGS. 8A and 8B are schematic elevational views showing respective optical-path forming members for forming a light-receiving-side optical path which is substantially axisymmetrical to the light-emitting-side optical path shown in FIG. 7.
Figure 8B:
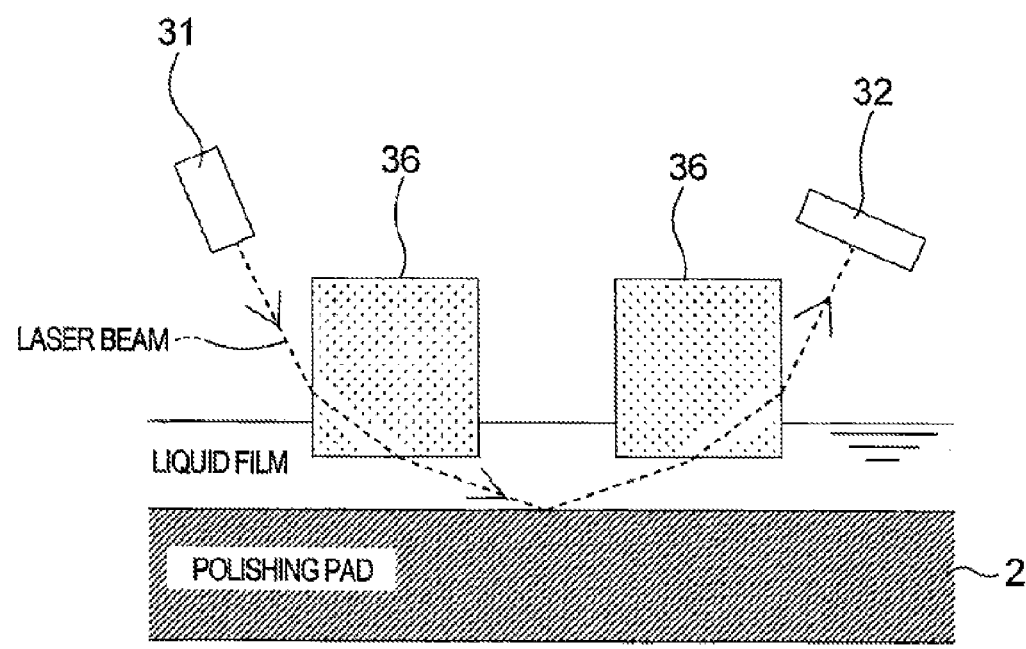

FIGS. 8A and 8B are schematic elevational views showing respective optical-path forming members for forming a light-receiving-side optical path which is substantially axisymmetrical to the light-emitting-side optical path shown in FIG. 7. As shown in FIG. 8A, the optical-path forming member 36 is in the form of a cuboid extending longitudinally parallel to the surface of the polishing pad and having a quadrangular cross-sectional shape. The cuboidal optical-path forming member 36 can form a light-receiving-side optical path which is axisymmetrical to the light-emitting-side optical path shown in FIG. 7. Specifically, the laser beam emitted from the light emitter 31 travels through the air and is refracted by two refractive surfaces of the optical-path forming member 36, and then travels through the liquid and is applied to the polishing pad 2. The light that is scattered by and bounced off the polishing pad 2 at a plurality of angles due to the surface properties of the polishing pad 2 travels through the liquid, and is applied to the optical-path forming member 36. Then, the light is refracted by two refractive surfaces of the optical-path forming member 36, and then travels through the air and is received by the light receiver 32. An optical path which includes a light-emitting-side optical path and a light-receiving-side optical path that are asymmetric to each other can freely be formed.

As shown in FIG. 8A, the optical-path forming member 36 may be of a polygonal cross-sectional shape including a quadrangular cross-sectional shape. Alternatively, as shown in FIG. 8B, the optical-path forming member 36 may be divided into a light-emitting-side optical-path forming member and a light-receiving-side optical-path forming member which have respective optimum refractive indexes and shapes. In this manner, the degree of freedom for the installation positions where the light emitter and the light receiver are installed can be guaranteed.

Although certain preferred embodiments of the present invention have been shown and described in detail, it should be understood that various changes and modifications may be made without departing from the scope of the appended claims.

What is claimed is:

1. A polishing apparatus for polishing a substrate, comprising:
   a polishing table configured to support a polishing pad;
   a carrier configured to hold the substrate and press the substrate against the polishing pad;
   a dam configured to dam a liquid on the polishing pad to form a liquid film having a thickness equal to or greater than a prescribed value, the dam being provided only in part of an area on the polishing pad and formed into an arcuately curved shape to allow the liquid on the polishing pad to flow into the dam and to allow the liquid in the dam to be discharged to the outside of the dam;
   a light emitter configured to emit a laser beam onto the polishing pad, the light emitter having a light emission end disposed in the liquid film formed by the dam;
   a light receiver configured to receive light scattered by and bounced off the polishing pad at a plurality of angles due to surface properties of the polishing pad, after the laser beam is emitted from the light emitter, the light receiver being disposed in the liquid film formed by the dam; and
   a processor configured to perform Fourier transform on the light received by the light receiver into a predetermined wavelength corresponding to a reflection intensity distribution and to determine a feature quantity of the surface properties of the pad.

2. The polishing apparatus according to claim 1, wherein the light emitter is connected to a light source by an optical fiber.

3. The polishing apparatus according to claim 1, wherein the light emitter and/or the optical-path forming member is disposed such that the laser beam is applied from the light emitter to a surface of the polishing pad at an angle of 80 degrees±10 degrees with respect to a line perpendicular to the polishing pad.

4. The polishing apparatus according to claim 1, wherein the light receiver comprises a plurality of optical fibers.

5. The polishing apparatus according to claim 1, wherein the light receiver comprises a CCD sensor or a CMOS sensor.

6. The polishing apparatus according to claim 1, further comprising a sensor configured to detect a position on the surface of the polishing pad and a moving mechanism configured to move at least two of the light emitter, the light receiver, and the optical-path forming member integrally, so that the laser beam is applied to a constant position on the surface of the polishing pad or the light is received from the surface of the polishing pad at a prescribed scattering angle.

7. A polishing method comprising:
   using a polishing apparatus according to claim 1; and
   adjusting at least one of dressing parameters including a dressing load; a dresser rotational speed, a polishing table rotational speed, a dresser swinging speed, and a dresser swinging distance, on the basis of the feature quantity of the surface properties of the pad determined by the processor.

8. A polishing method comprising;
   using a polishing apparatus according to claim 1; and
   estimating a service life of at least one of a dresser and the polishing pad on the basis of the feature quantity of the surface properties of the pad determined by the processor, and issuing an alarm if the estimated service life exceeds a predetermined value.

9. The polishing apparatus according to claim 1, wherein the polishing table is configured to be rotated, and the dam comprises a plate which is curved along an outer circumference of the polishing table.

10. The polishing apparatus according to claim 1, wherein the polishing table is configured to be rotated, and the dam is arranged to dam the liquid on the polishing pad in a centrifugal direction of the polishing table.

11. The polishing apparatus according to claim 1, wherein the light emitter and the light receiver are separately provided, and a light emission end of the light emitter and a light receiving surface of the light receiver are arranged to be completely immersed in the liquid film formed by the dam.

* * * * *